(12) United States Patent
Lee et al.

(10) Patent No.: US 7,642,858 B2
(45) Date of Patent: Jan. 5, 2010

(54) ACTIVE BALUNS

(75) Inventors: Dong Ho Lee, Atlanta, GA (US); Ki Seok Yang, Atlanta, GA (US); Yunseok Kim, Gyung-gi-do (KR); Sanghee Kim, Gyung-gi-do (KR); Hyogeun Bae, Gyung-gi-do (KR); Kijoong Kim, Gyung-gi-do (KR); Li Lee, Gyung-gi-do (KR); Songcheol Hong, Daejeon (KR); Chang-Ho Lee, Marietta, GA (US); Haksun Kim, Daejeon (KR); Joy Laskar, Marietta, GA (US)

(73) Assignees: Samsung Electro-Mechanics Company (KR); Georgia Tech Research Corporation, Atlanta, GA (US)

( * ) Notice: Subject to any disclaimer, the term of this patent is extended or adjusted under 35 U.S.C. 154(b) by 16 days.

(21) Appl. No.: 11/970,192

(22) Filed: Jan. 7, 2008

(65) Prior Publication Data
US 2008/0272849 A1 Nov. 6, 2008

(51) Int. Cl.
*H03F 3/04* (2006.01)

(52) U.S. Cl. ...................... 330/301; 330/305

(58) Field of Classification Search ............ 330/301, 330/305, 252, 257, 261
See application file for complete search history.

(56) References Cited

U.S. PATENT DOCUMENTS

| 6,366,171 | B1 * | 4/2002 | Litmanen et al. | 330/301 |
| 7,098,742 | B2 * | 8/2006 | Johnson | 330/301 |
| 7,113,045 | B2 * | 9/2006 | Westwick et al. | 330/301 |
| 7,193,475 | B2 * | 3/2007 | Su et al. | 330/301 |

* cited by examiner

*Primary Examiner*—Henry K Choe
(74) *Attorney, Agent, or Firm*—Sutherland Asbill & Brennan LLP (57) ABSTRACT

Example embodiments of the invention may provide for active baluns. An example active balun may include a resonator that may convert a single-ended input signal to at least two differential input signals, and a differential switching block that includes first and second transistors that each receive a respective one of the at least two differential input signals from the resonator, where the first and second transistors may be cross-coupled to each other to provide a first differential output signal and a second differential output signal. An example active balun may further include one or more loads connected to the first and second differential output signals, and one or more stacked inverters that may provide a first output port and a second output port, where the first output port may be responsive to the first differential output signal and the second output port may be responsive to the second differential output signal.

19 Claims, 11 Drawing Sheets

ACTIVE BALUNS

RELATED APPLICATION

The present application claims priority under 35 U.S.C. 119 to Korean Patent Application Number 10-2007-0043739, filed May 4, 2007, and entitled "Resonance Active Balun," which is hereby incorporated by reference in its entirety as if fully set forth herein.

FIELD OF INVENTION

Embodiments of the invention relate generally to baluns, and more particularly to active baluns.

BACKGROUND OF THE INVENTION

In general, a balun, which is an abbreviation of "balance-unbalance," is a device that transforms unbalanced or single-ended signals to balanced or differential signals, or vice versa. A balun can categorized as either an active balun or a passive balun, depending on whether the balun includes active devices or not.

Figure 1:
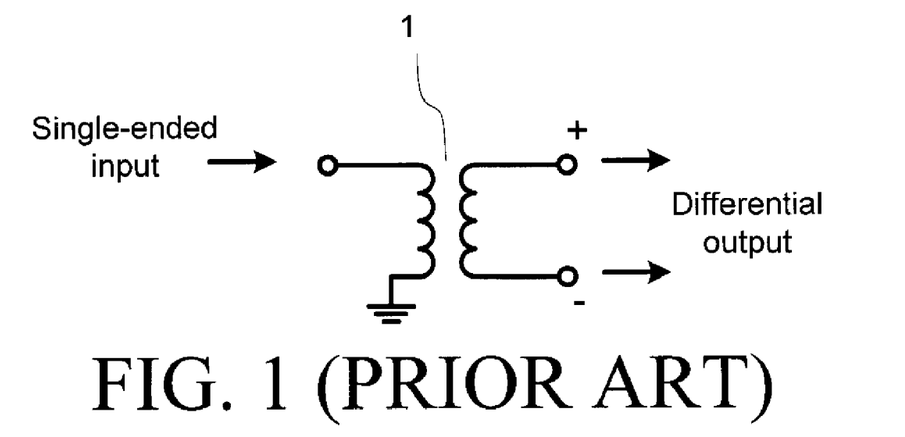
FIG. 1 is a schematic diagram for a conventional passive balun using a transformer.

A conventional passive balun is generally a transformer 1, as illustrated in FIG. 1. Referring to the transformer of FIG. 1, when a single-ended signal is applied to the primary winding, magnetically induced current from the primary winding flows through the secondary winding. Differential signals are obtained from the ends of the secondary winding. A passive balun can operate irrespective of the amplitude of the input signal. Further, the phase and amplitude balance errors for a passive balun are smaller than those of an active balun, and the operation bandwidth is larger. However, a passive balun is lossy and bulky because of the transformer. Therefore, a passive balun is difficult to implement on integrated chips.

Figure 2:
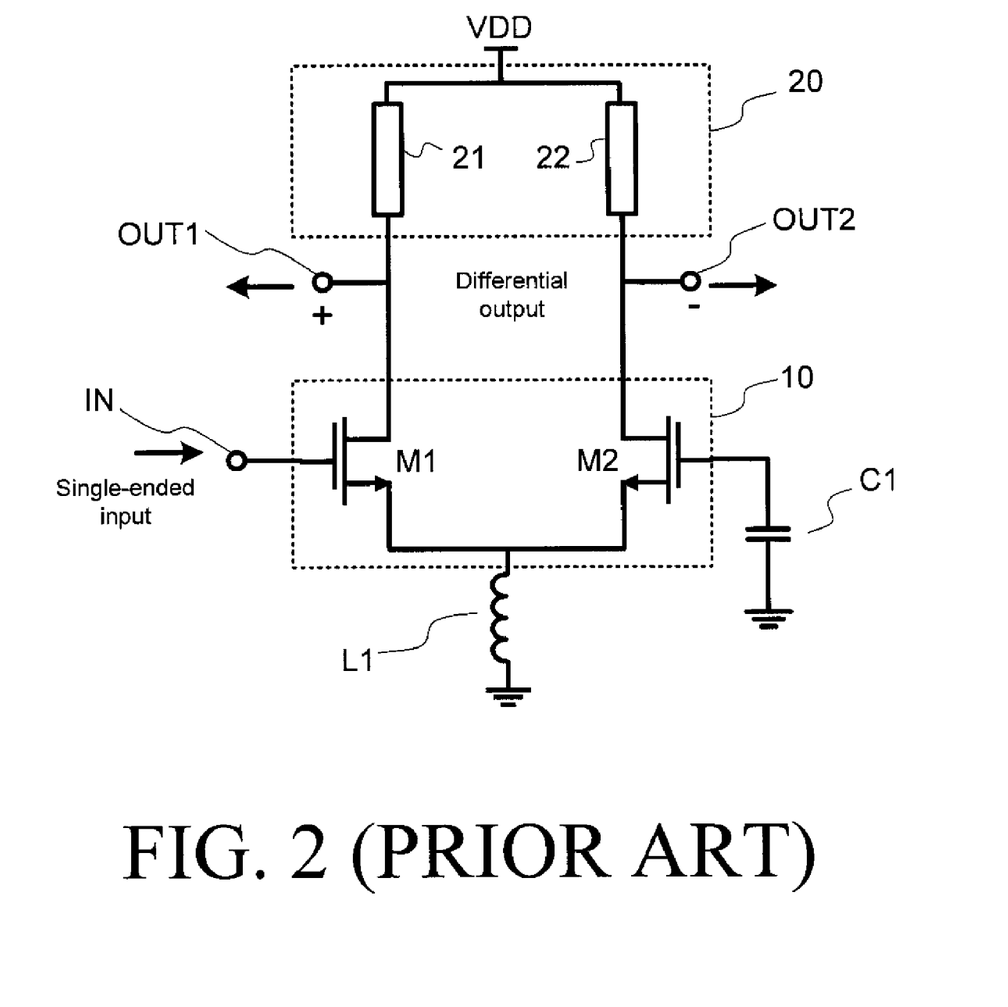
FIG. 2 is a schematic diagram of a conventional active balun using a differential amplifier.

On the other hand, a conventional active balun is illustrated in FIG. 2. The active balun of FIG. 2 includes a differential amplifier 10 and a load 20. The differential amplifier 10 includes two transistors M1, M2 whose sources are connected to ground. The first transistor M1 has an input port at its gate, and the gate of the second transistor M2 is connected to a capacitor C1 whose opposite end is grounded for AC grounding. The differential output signals OUT1, OUT2 are obtained from the drains of transistors M1, M2. The loads 21, 22 are high impedance networks. The active balun has comparably large balance errors owing to its asymmetry. Furthermore, as the single-ended input signal increases, transistor M1 goes to saturation prior to transistor M2, and the leakage signal from transistor M1 enters transistor M2, and finally the large common-mode signals are amplified. Therefore, as the input signal increases, the balance errors also increase for a conventional active balun.

BRIEF SUMMARY OF THE INVENTION

Example embodiments of the invention may provide for an active balun, which may include a resonator, a differential switching block, one or more loads, and optional common-gate/common-base amplifiers. The active balun may transform a single-ended input signal to differential output signals, perhaps with high gain and low balance errors. According to an example aspect, the resonator may generate differential signals from the single-ended input signal. According to another example aspect, the differential switching block may amplify the differential signals from the resonator and reduce the balance errors. According to yet another example aspect, the optional common-gate/common-base amplifiers may increase the gain and reduce the balance errors.

According to an example embodiment of the invention, there is an active balun. The active balun may include a resonator that may convert a single-ended input signal to at least two differential input signals, and a differential switching block that may include first and second transistors that each receive a respective one of the at least two differential input signals from the resonator, where the first and second transistors may be cross-coupled to each other to provide a first differential output signal and a second differential output signal.

According to another embodiment of the invention, there is another active balun. The active balun may include a resonator that may convert a single-ended input signal to at least two differential input signals, and a differential switching block that includes first and second transistors that each receive a respective one of the at least two differential input signals from the resonator, where the first and second transistors may be cross-coupled to each other to provide a first differential output signal and a second differential output signal. The active balun may further include one or more loads connected to the first and second differential output signals, and one or more stacked inverters that may provide a first output port and a second output port, where the stacked inverters may be connected between the one or more loads and (i) a voltage source, (ii) a ground, or (iii) a current source, where the stacked inverters may be operative as output buffers for the first output port and the second output port, where the first output port may be responsive to the first differential output signal and the second output port may be responsive to the second differential output signal.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 3:
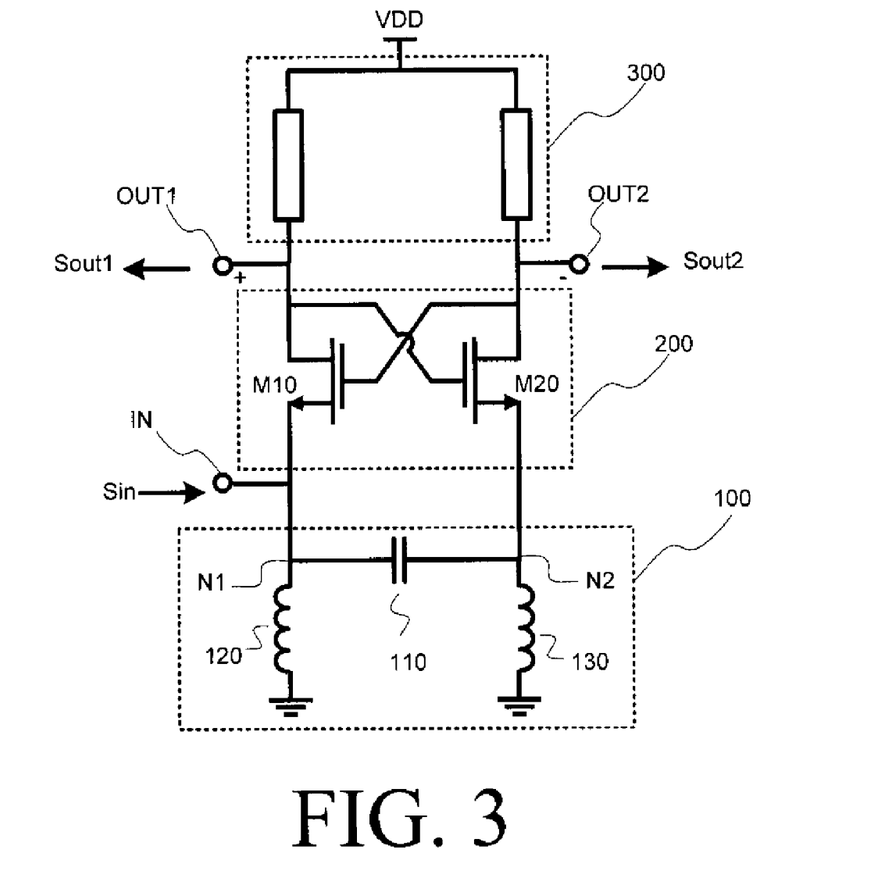
FIG. 3 illustrates a schematic diagram of an example active balun using metal-oxide-semiconductor field-effect transistors (MOSFETs), according to an example embodiment of the invention.

FIG. 3 illustrates an example active balun in accordance with an example embodiment of the invention. As shown in FIG. 3, the example active balun may include a resonator 100, which may transform a single-ended input signal Sin to differential signals, and a differential switching block 200, which generates first and second differential output signals Sout1, Sout2 based upon the differential signals received from the resonator 100. The differential switching block 200 may be operative to amplify and/or reduce balance errors in the differential signals received from the resonator 100, according to an example embodiment of the invention.

In addition, the example active balun of FIG. 3 may also include one or more loads 300. The one or more loads 300 may be positioned between a voltage source or power supply VDD (or alternatively, a current source or ground) and output ports OUT1, OUT2. According to an example embodiment of the invention, the one or more loads 300 may be operative to provide high impedance to the differential switching block 200, thereby providing for high gain. It will also be appreciated that the one or more loads 300 may be replaced with current sources or high impedance passive circuits without departing from example embodiments of the invention.

Still referring to FIG. 3, the resonator 100 may include a first resonant component 110, a second resonant component 120, and a third resonant component 130, according to an example embodiment of the invention. The first resonant component 110 may include a first node N1 and a second node N2, where the first node N1 may be connected to the input port IN. The second resonant component 120 may be connected between the first input port IN and ground. The third resonant component 130 may be connected between the second node N2 of the first resonant component 110 and ground. According to an example embodiment of the invention, the first resonant component 10 may be a capacitor while the second and third resonant components 120, 130 may be inductors. According to another example embodiment of the invention, the first resonant component 110 may be an inductor while the second and third resonant components 120, 130 may be capacitors, perhaps with parallel DC flowing components. The resonator 100 of FIG. 3 may be operative to resonate at an operating frequency, according to an example embodiment of the invention. Accordingly, the first resonant component 110, second resonant component 120, and third resonant component 130 may be selected to obtain the desired operating frequency for the resonator 100, according to an example embodiment of the invention.

A single-ended input signal Sin at the node N1 may be inverted at node N2 by the resonator 100, according to an example embodiment of the invention. In the switching block 200 of FIG. 3, the source and the drain of the first transistor M10 may be connected to a first node N1 of the first resonant component 110 and the output port OUT1, respectively, while the source and the drain of the second transistor M20 may be connected to a second node N2 of the first resonant component 110 and the output port OUT2, respectively. The first and the second transistors M10, M20 may also be cross-coupled, according to an example embodiment of the invention. For example, the first and second transistors M10, M20 may be gate-drain cross coupled, according to an example embodiment of the invention. With gate-drain cross coupling, the gate of transistor M10 may be connected to the drain of transistor M20 while the gate of transistor M20 may be connected to the drain of transistor M10. The differential switching block 200 may operate as a latch with positive feedback by the gate-drain cross coupling, according to an example embodiment of the invention. Accordingly, even if the amplitude of the differential signal is small or the phase difference is not exactly 180°, the differential switching block 200 may operate differentially and correct any balance errors. When the single-ended input signal Sin goes low, transistor M10 may be turned on and transistor M20 may be turned off, according to an example embodiment of the invention. Otherwise, when the single-ended input signal Sin goes high, transistor M10 may be turned off and transistor M20 may be turned on, according to an example embodiment of the invention. The active balun may generate the first and second differential output signals Sout1, Sout2 at the output ports OUT1, OUT2, according to an example embodiment of the invention. It will be appreciated that the first and second transistors M10, M20 in the differential switching block 200 may be metal-oxide-semiconductor field-effect transistors (MOSFETs), according to an example embodiment of the invention. However, other transistors may also be utilized, including bipolar junction transmitters (BJTs), without departing from example embodiments of the invention.

Figure 4:
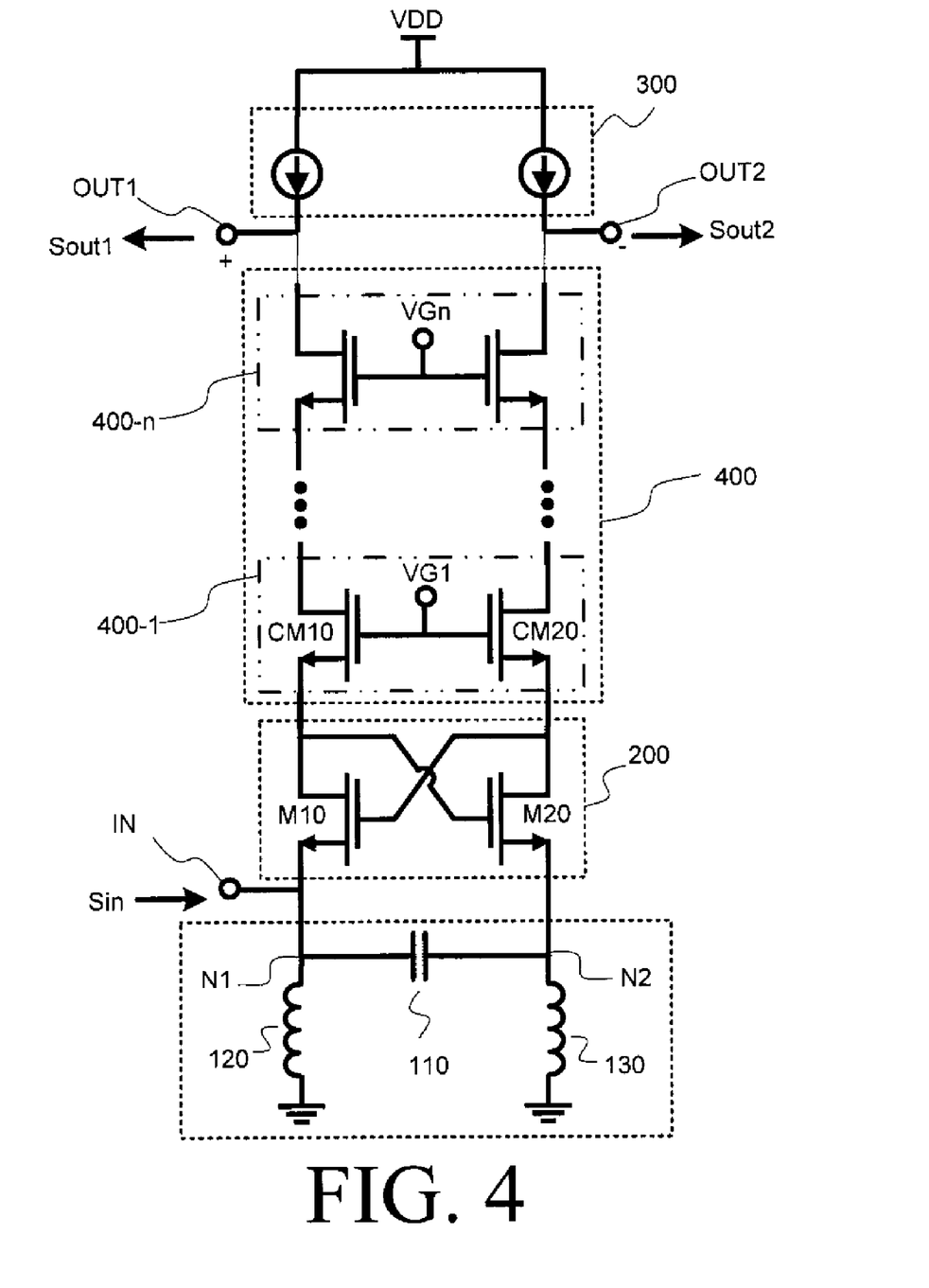
FIG. 4 illustrates a schematic diagram of an example active balun with differential common-gate amplifiers using MOSFETs, according to an example embodiment of the invention.

FIG. 4 illustrates a schematic of another example active balun with differential common-gate amplifiers, according to an example embodiment of the invention. In FIG. 4, one or more differential common-gate amplifiers 400-1 . . . n may be positioned between the differential switching block 200 and output ports OUT1, OUT2. For example, in the differential common-gate amplifier 400-1, a common-gate transistors CM10 may be connected between the first transistor MI0 and the output port OUT1 while another common-gate transistor CM20 may be connected between the second transistor M20 and the output port OUT2. Additionally, the gates of the common-gate transistors CM10, CM20 may be connected to each other with a gate bias port VG1. According to an example embodiment of the invention, there may be a plurality of common-gate amplifiers 400-1 . . . n that are stacked or cascaded, perhaps from respective sources to drains, as shown in FIG. 4. The gates of the multiple differential common-gate amplifiers 400-1 . . . n may biased using respective gate bias ports VG1 . . . n. According to an example embodiment of the invention, the one or more differential common-gate amplifiers 400-1 . . . n may be operative to amplify the differential signals and/or reject a common-mode signal. Accordingly, the differential common-gate amplifiers 400-1 . . . n may increase gain and/or reduce balance errors of the differential signals, according to an example embodiment of the invention.

Figure 5:
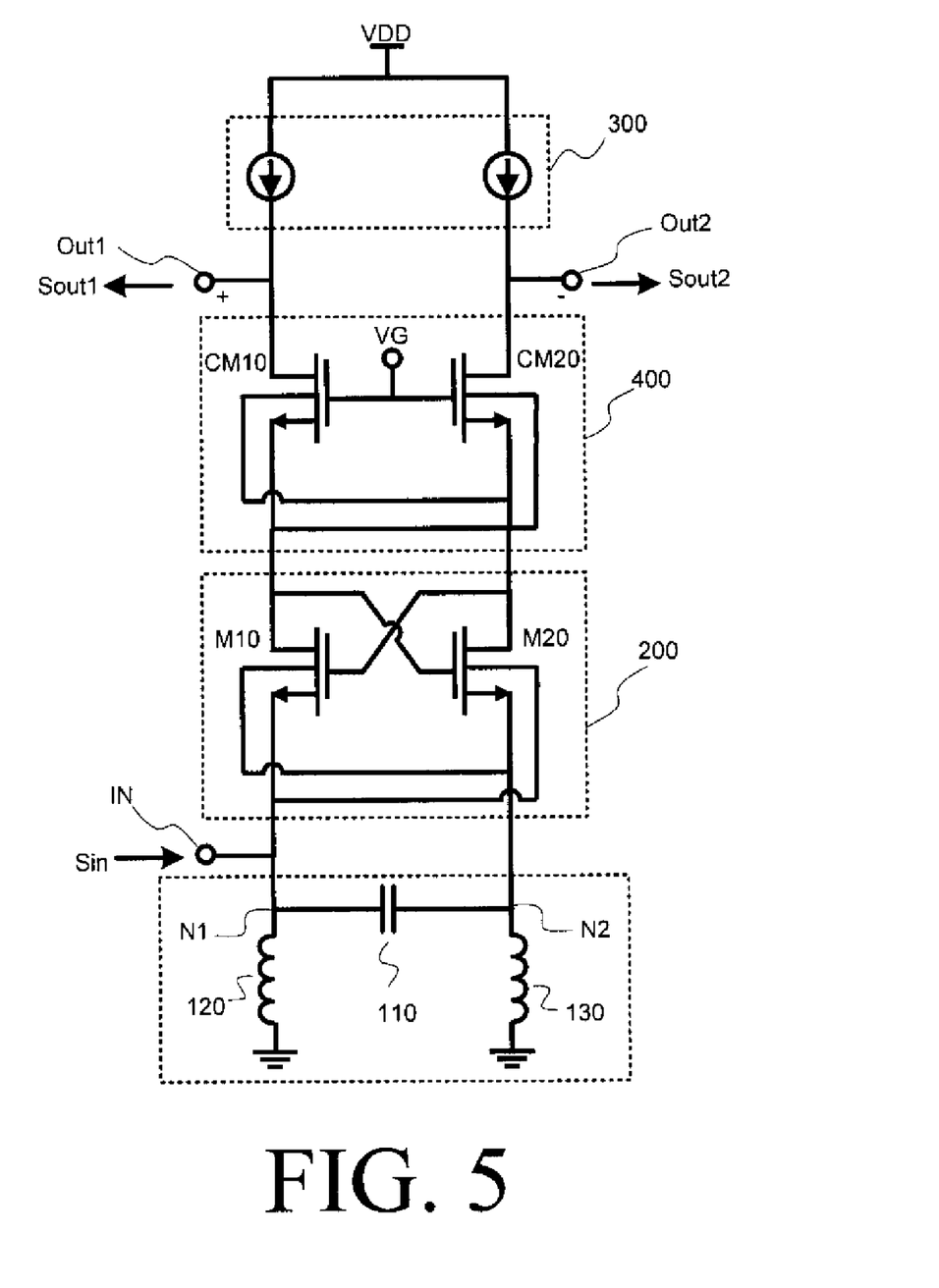
FIG. 5 is a schematic diagram of an example active balun with differential common-gate amplifiers and source-body cross-coupling using MOSFETs, according to an example embodiment of the invention.

FIG. 5 illustrates a schematic diagram of another example active balun with a differential common-gate amplifier using body-source cross coupling, according to an example embodiment of the invention. In the switching block 200 of FIG. 5, the transistors M10, M20 may be gate-drain cross coupled, according to an example embodiment of the invention. With gate-drain cross coupling, the gate of the first transistor M10 may be connected to the drain of the second transistor M20 while the gate of the second transistor M20 may be connected to the drain of the first transistor M10.

Still referring to FIG. 5, the switching block 200 may also utilize body-source cross coupling with the transistors M10, M20. With body-source cross coupling, the source of the first transistor M10 may be connected to the body of the second transistor M20 while the source of the second transistor M20 may be connected to the body of the first transistor M10. According to an example embodiment of the invention, the body-source cross coupling may provide for a body-effect only in AC, but not in DC, because the body and the source have the same DC potential. Therefore, this body-source cross coupling may increase AC gain and avoids DC breakdown by the body effect.

The example active balun of FIG. 5 may further include a differential common-gate amplifier 400 that may be positioned between the differential switching block 200 and output ports OUT1, OUT2. With the differential common-gate amplifier 400, the gates of the common-gate transistors CM10, CM20 may be biased at the gate bias port VG. In addition, the common-gate transistors CM10, CM20 may be cross-coupled, perhaps using body-source cross coupling, according to an example embodiment of the invention. With body-source cross coupling, the source of the common-gate transistor CM10 may be connected to the body of the common-gate transistor CM20 and the source of the common-gate transistor CM20 may be connected to the body of the common-gate transistor CM10. According to an example embodiment of the invention, the body-source cross coupling may increases gain of the common-gate transistors with a body effect. In this situation, the first and second differential output signals Sout1, Sout2 from the output ports OUT1, OUT2 may be increased and/or amplified by the common-gate amplifier 400.

Figure 6:
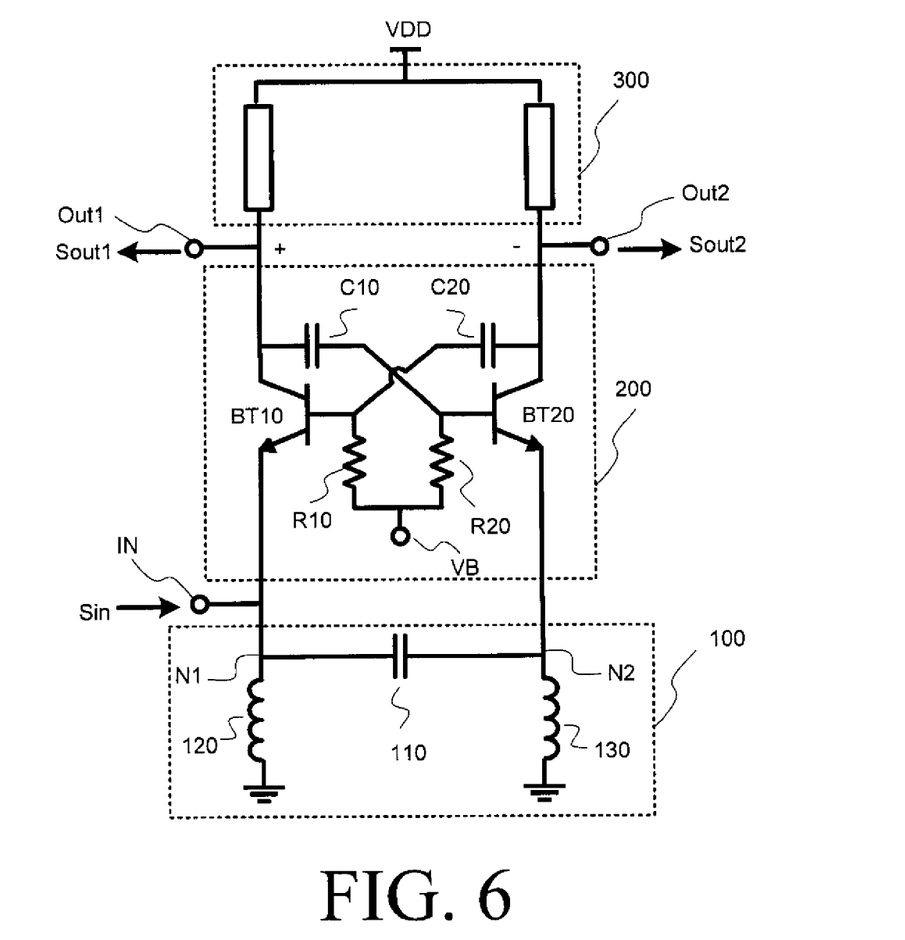
FIG. 6 is a schematic diagram of an example active balun using Bipolar Junction Transistors (BJTs), according to an example embodiment of the invention.

FIG. 6 illustrates a schematic diagram of the example active balun using Bipolar Junction Transistors (BJTs), according to an example embodiment of the invention. The example active balun of FIG. 6 may include a resonator 100, which may be operative to transform a single-ended input signal Sin to differential signals, and a differential switching block 200, which generates first and second differential output signals Sout1, Sout2 based upon the differential signals received from the resonator 100. The differential switching block 200 may be operative to amplify and/or reduce balance errors in the differential signals received from the resonator 100, according to an example embodiment of the invention.

In addition, the example active balun of FIG. 6 may also include one or more loads 300. The one or more loads may be positioned between a voltage source or power supply VDD (or alternatively, a current source or ground) and output ports OUT1, OUT2. According to an example embodiment of the invention, the one or more loads 300 may be operative to provide high impedance to the differential switching block 200. It will be appreciated that the one or more loads 300 may likewise be replaced with current sources or high impedance passive circuits without departing from example embodiments of the invention.

Still referring to FIG. 6, the resonator 100 may include a first resonant component 110, a second resonant component 120, and a third resonant component 130. The first resonant component may include a first node N1 and a second node N2, where the first node N1 may be connected to the input port IN. The second resonant component 120 may be connected between the first input port IN and ground. The third resonant component 130 may be connected between the second node N2 of the first resonant component 110 and ground. According to an example embodiment of the invention, the first resonant component 110 may be a capacitor while the second and third resonant components 120, 130 may be inductors. According to another example embodiment of the invention, the first resonant component 110 may be an inductor while the second and third resonant components 120, 130 may be capacitors, perhaps with parallel DC flowing components. The resonator 100 of FIG. 3 may be operative to resonate at an operating frequency, according to an example embodiment of the invention. Accordingly, the first resonant component 110, second resonant component 120, and third resonant component 130 may be selected to obtain the desired operating frequency for the resonator 100, according to an example embodiment of the invention.

A single-ended input signal Sin at the node N1 may be inverted at node N2 by the resonator 100, according to an example embodiment of the invention. In the switching block 200 of FIG. 6, the emitter and the collector of the first transistor BT10 (e.g., BJT) may be connected with a first node N1 of the first resonant component 110 and the output port OUT1, respectively, while the emitter and the collector of the second transistor BT20 may be connected with a second node N2 of the first resonant component 110 and the output port OUT2, respectively. The first and second transistors BT10, BT20 may be cross coupled, according to an example embodiment of the invention. For example, the first and second transistors BT10, BT20 may be base-collector cross coupled, according to an example embodiment of the invention. With base-collector cross coupling, the base of the first transistor BT10 may be connected to the collector of the second transistor BT20, perhaps through a DC blocking capacitor C20 while the base of the second transistor BT20 may be connected to the collector of the first transistor BT10 through a DC blocking capacitor C10, according to an example embodiment of the invention. The bases of the transistors BT10, BT20 may also be biased with base bias port VB through resistors R10, and R20, respectively. The differential switching block 200 may operate as a latch with positive feedback by the base-collector cross coupling, according to an example embodiment of the invention. Accordingly, even if the amplitude of the differential signal is small or the phase difference is not exactly 180°, the differential switching block 200 may operate differentially and correct any balance errors. When the single-ended input signal Sin goes low, transistor BT10 may be turned on and transistor BT20 may be turned off. Otherwise, when the single-ended input signal Sin goes high, transistor BT10 may be turned off and transistor BT20 may be turned on, according to an example embodiment of the invention. The active balun may generate differential signals Sout1, Sout2 at the output ports OUT1, OUT2, according to an example embodiment of the invention. It will be appreciated that the first and second transistors BT10, BT20 in the differential switching block 200 may be Bipolar Junction Transistors (BJTs), according to an example embodiment of the invention. However, other transistors may also be utilized without departing from example embodiments of the invention.

Figure 7:
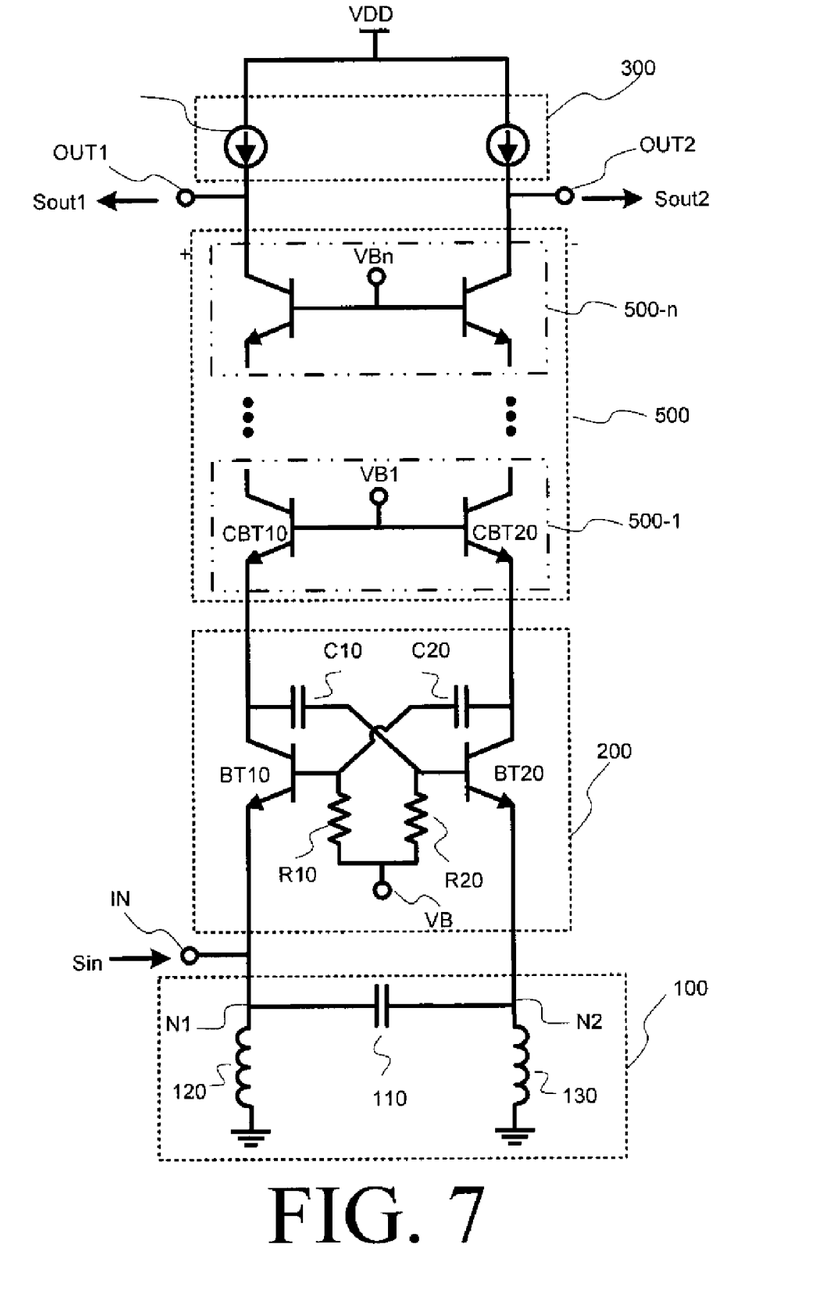
FIG. 7 is a schematic diagram of an example active balun with differential common-base amplifiers using BJTs, according to an example embodiment of the invention.

FIG. 7 illustrates a schematic of an example active balun with differential common-base amplifiers using BJTs, according to an example embodiment of the invention. In FIG. 7, one or more differential common-base amplifiers 500-1 . . . n may be positioned between the differential switching block 200 and output ports OUT1, OUT2. Indeed, a common-base transistor CBT10 may be connected between the first transistor BT10 and the output port OUT1 while another common-base transistor CBT20 may be connected between the second transistor BT20 and the output OUT2. Additionally, the bases of the common-base transistors CBT10, CBT20 are connected each other with a base bias port VB1. According to an example embodiment of the invention, there may be a plurality of common-base amplifiers 500-1 . . . n that are cascaded from respective emitters to collectors, as shown in FIG. 7. The bases of the multiple differential common-base amplifiers 500-1 . . . n may be biased using respective base bias ports VB1 . . . n. According to an example embodiment of the invention, the one or more differential common-base amplifiers 500-1 . . . n may be operative to amplify the differential signals and/or reject a common-mode signal. Accordingly, the differential common-base amplifiers 500-1 . . . n may be operative to increase gain and/or reduce balance errors, according to an example embodiment of the invention.

Figure 8:
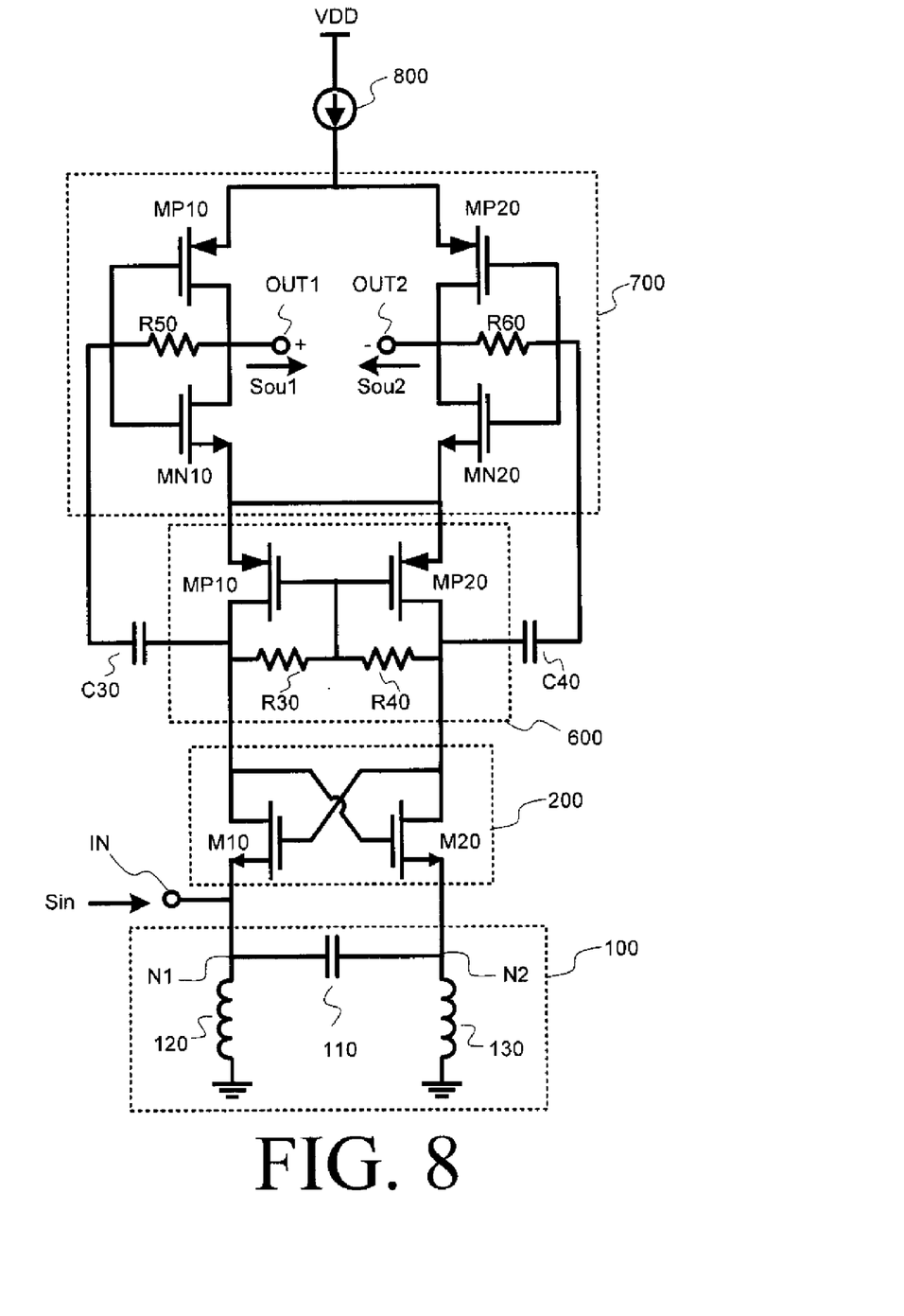
FIG. 8 is a schematic diagram of an example active balun with stacked inverters, according to an example embodiment of the invention.

FIG. 8 illustrates a schematic diagram of another example active balun with stacked inverters, according to an example embodiment of the invention. In FIG. 8, one or more active loads 600 may be positioned between the differential switching block 200 and the stacked inverters 700, according to an example embodiment of the invention. The active loads 600 may operate as a load with high impedance and low voltage drop. The stacked inverters 700 may be positioned between the active loads 600 and a current source 800, according to an example embodiment of the invention.

According to an example embodiment of the invention, the active loads 600 may be comprised of a P-type transistors MP10, MP20, including P-type MOSFETs. The gate of transistor MP10 may be connected to the gate of MP20, as well as to the first ends resistors R30, R40. The second ends of resistors R30, R40 may be connected to the respective drains of transistors MP10, M20. Additionally, the source of transistor MP10 may be connected to the stacked inverters 700, as shown in FIG. 8. It will be appreciated that while MOSFETs are illustrated in the active loads, other example embodiments of the invention may utilize other transistors, including BJTs.

Still referring to FIG. 8, the stacked inverters 700 may be comprised of an N-type transistor MN10 and a P-type transistor MP10, which may be MOSFETs, according to an example embodiment of the invention. The gate of the N-type MOSFET MN10 may be connected with the gate of the P-type MOSFET MP10, a bias resistor R50, and a DC blocking capacitor C30, according to an example embodiment of the invention. The drain of the N-type MOSFET MN10 may be connected with the drain of the P-type MOSFET MP10, the other end of the bias resistor R50, and an output port OUT1, according to an example embodiment of the invention. The source of the N-type MOSFET MN10 may be connected with the active loads 600 and the source of the P-type MOSFET MP10 may be connected with a current source 800 (or alternatively, a voltage source or ground), according to an example embodiment of the invention.

Similarly, the stacked inverters 700 may be comprised of an N-type transistor MN20 and a P-type transistor MP20, which may include MOSFETs, according to an example embodiment of the invention. The gate of the N-type MOSFET MN20 may be connected with the gate of the P-type MOSFET MP20, a bias resistor R60, and a DC blocking capacitor C40, according to an example embodiment of the invention. The drain of the N-type MOSFET MN20 may be connected with the drain of the P-type MOSFET MP20, the other end of the bias resistor R60, and an output port OUT2, according to an example embodiment of the invention. The source of the N-type MOSFET MN20 may be connected with the active loads 600, as well as the source of N-type MOSFET MN10, according to an example embodiment of the invention. The source of the P-type MOSFET MP20 may be connected with the current source 800 (or alternatively, a voltage source or ground), as well as the source of the P-type MOSFET MP10, according to an example embodiment of the invention. It will be appreciated that while MOSFETs have been used to illustrate the transistors in FIG. 8, other example embodiments of the invention may also utilize other transistors, including NPN and PNP BJTs.

In FIG. 8, the differential signals from the switching block 200 may be provided to the stacked inverter 700 through capacitors such as DC blocking capacitors C30, C40. The stacked inverters 700 may amplify the differential signals and/or act as an output buffer to keep the active balun isolated from subsequent circuits, according to an example embodiment of the invention. With the stacked inverters 700, high gain increases and high isolation from the outputs to the input may be achieved, according to an example embodiment of the invention.

Simulation and Experimental Results

Figure 9:
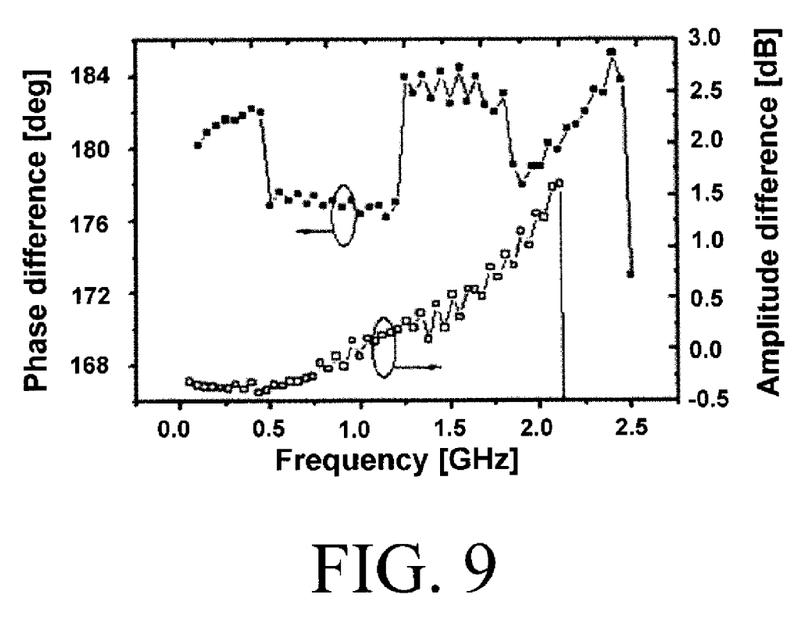
FIG. 9 is a graph of example active balun measurement results of phase and amplitude differences versus frequency, according to an example embodiment of the invention.

FIG. 9 illustrates example measured results for the operation of an example active balun in accordance with an example embodiment of the invention. Specifically, the measurement results in FIG. 9 illustrate phase and amplitude differences of the example active balun based upon the frequency. As shown in FIG. 9, the phase error is less than 4° from 100 MHz to 2.4 GHz and the amplitude error is less than 0.5 dB from 100 MHz to 1.8 GHz. Accordingly, the results of FIG. 9 show an example active balun having good balancing, according to an example embodiment of the invention.

Figure 10:
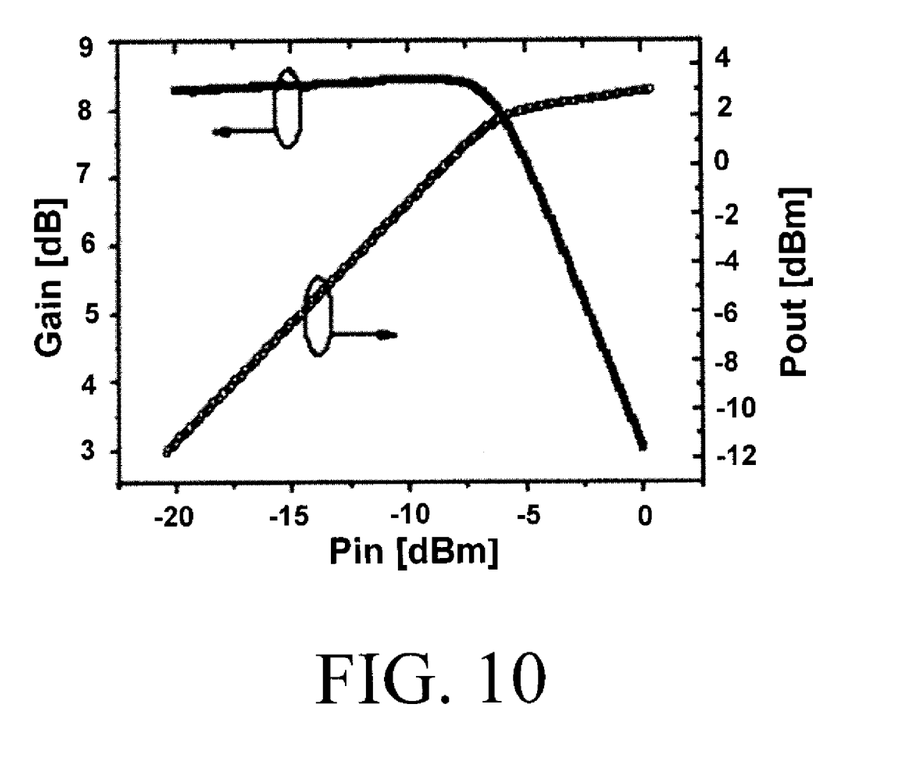
FIG. 10 is a graph of example active balun measurement results of gain and output power versus input power at 1.3 GHz, according to an example embodiment of the invention.

FIG. 10 illustrates example measured results for the operation of an example active balun in accordance with an embodiment of the invention. The measurement results of FIG. 10 illustrate gain and output power of the active balun with input power. The results shows 8.3 dB of gain and 2.5 dBm of P1dB (output power) at 1.3 GHz.

Figure 11:
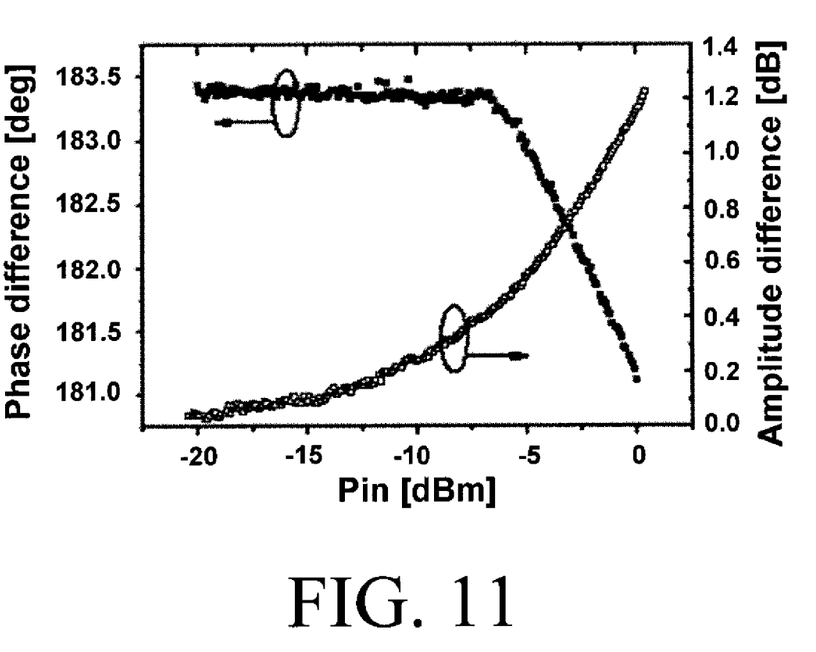
FIG. 11 is a graph of example active balun measurement results of phase and amplitude differences versus input power at 1.3 GHz, according to an example embodiment of the invention.

FIG. 11 illustrates example measured results for the operation of an example active balun in accordance with an embodiment of the invention. The measurement results of FIG. 1 illustrate phase and amplitude difference of the active balun with input power at 1.3 GHz. The phase error is less than 3.5° from −20 dBm to 0 dBm of input power. The amplitude error is less than 1.2 dB from −20 dBm to 0 dBm of input power. Accordingly, the results of FIG. 11 show an example active balun having good balancing, according to an example embodiment of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An active balun, comprising:
 a resonator that converts a single-ended input signal to at least two differential input signals; and
 a differential switching block that includes first and second transistors that each receive a respective one of the at least two differential input signals from the resonator, wherein the first and second transistors are cross-coupled to each other to provide a first differential output signal and a second differential output signal, wherein the resonator includes:

a first resonant component having a first end and a second end, wherein a first end is connected to the first transistor and the second end is connected to the second transistor, wherein an input port for the single-ended input signal is provided at the first end or the second end, a second resonant component connected between the first end of the first resonant circuit and ground, and a third resonant component connected between the second end of the first resonant component and ground.

2. The active balun of claim 1, wherein the first differential output signal is provided to a first differential output port and the second differential output signal is provided to a second differential output port, and further comprising:

one or more loads connected between the first and second output ports and at least one of (i) a voltage supply, (ii) a current supply, or (iii) ground.

3. The active balun of claim 2, wherein the one or more loads includes one or more of high impedance networks.

4. The active balun of claim 3, wherein the one or more high impedance networks include one of (i) current sources with high impedance, or (ii) passive loads with high impedance.

5. The active balun of claim 1, wherein the resonator includes (i) a first capacitor as the first resonant component, a first inductor as the second resonant component, and a second inductor as the third resonant component, or (ii) a third inductor as the first resonant component, a second capacitor as the second resonant component, and a third capacitor as the third resonant component.

6. The active balun of claim 1, wherein the first transistor includes a first source, a first gate, and a first drain, and the second transistor includes a second source, a second gate, and a second drain, wherein the first source is connected to the first end of the first resonant component, the first drain is connected to the first differential output signal, and the first gate is connected to the second drain of the second transistor, and wherein the second source is connected to the second end of the first resonant component, the second drain is connected to the second differential output signal, and the second gate is connected to the first drain of the first transistor.

7. The active balun of claim 6, wherein the first transistor includes a first body and the second transistor includes a second body, wherein the first body is connected to the second source, and wherein the second body is connected to the first source.

8. The active balun of claim 1, wherein the first transistor includes a first emitter, a first collector, and a first base, and the second transistor includes a second emitter, a second collector, and a second base, wherein the first emitter is connected to the first end of the first resonant component, the first collector is connected to the first differential output signal, and the first base is connected to the second drain of the second transistor via a first capacitor, and wherein the second emitter is connected to the second end of the first resonant component, the second collector is connected to the second differential output signal, and the second base is connected to the first collector of the first transistor via a second capacitor.

9. The active balun of claim 1, further comprising:

at least one differential amplifier block that receives the first and second differential output signals and provides a first amplified differential output signal and a second amplified differential output signal.

10. The active balun of claim 9, wherein the differential amplifier block includes common-gate or common-base amplifiers.

11. The active balun of claim 9, wherein the at least one differential amplifier block includes at least a first and second set of common-gate or common-base amplifiers that are cascaded together.

12. The active balun of claim 9, wherein the differential amplifier block includes a third transistor having a third source, a third drain, and a third gate, and a fourth transistor having a fourth source, a fourth drain, and a fourth gate, wherein the third gate and the fourth gate are connected together, wherein the third source is connected to the first differential output signal and the third drain provides the first amplified differential output signal, and wherein the fourth source is connected to the second differential output signal and the fourth drain provides the second amplified differential output signal.

13. The active balun of claim 12, wherein the third transistor further includes a third body and the fourth transistor includes a fourth body, wherein the third source is connected to the fourth body, and wherein the fourth source is connected to the third body.

14. The active balun of claim 9, wherein the differential amplifier block includes a third transistor having a third emitter, a third collector, and a third base, and a fourth transistor having a fourth emitter, a fourth collector, and a fourth base, wherein the third base and the fourth base are connected together, wherein the third emitter is connected to the first differential output signal and the third collector provides the first amplified differential output signal, and wherein the fourth emitter is connected to the second differential output signal and the fourth collector provides the second amplified differential output signal.

15. The active balun of claim 1, wherein the first and second transistors include MOSFETs or BJTs.

16. An active balun comprising:

a resonator that converts a single-ended input signal to at least two differential input signals;

a differential switching block that includes first and second transistors that each receive a respective one of the at least two differential input signals from the resonator, wherein the first and second transistors are cross-coupled to each other to provide a first differential output signal and a second differential output signal;

one or more loads connected to the first and second differential output signals; and one or more stacked inverters that provide a first output port and a second output port, wherein the stacked inverters are connected between the one or more loads and (i) a voltage source, (ii) a ground, or (iii) a current source, wherein the stacked inverters are operative as output buffers for the first output port and the second output port, wherein the first output port is responsive to the first differential output signal and the second output port is responsive to the second differential output signal.

17. The active balun of claim 16, wherein the one or more stacked inverters are comprised of (i) at least one N-type MOSFET and at least one P-type MOSFET, or (ii) at least one NPN BJT and at least one PNP BJT, and wherein the one or more loads include one or more active loads comprised of (i) N-type MOSFETs or P-type MOSFETs, or (ii) NPN BJTs or PNP BJTs.

18. The active balun of claim 16, wherein one or more loads includes one or more active loads comprising:
   a first active load MOSFET having a first source, a first gate, and a first drain;
   a second active load MOSFET having a second source, a second gate, and a second drain;
   a first resistor having a first end and a second end; and
   a second resistor having a third end and a fourth end, wherein the first gate is connected to the second gate, the first end of the first resistor, and the third end of the second resistor, wherein the second end of the first resistor is connected to the first differential output signal and the first drain, wherein the fourth end of the second resistor is connected to the second differential output signal, the second drain and the second drain, wherein the first source and the second source are connected to the one or more stacked inverters.

19. The active balun of claim 16, wherein the one or more stacked inverters include:
   an N-type MOSFET having a first source, a first drain, and a first gate;
   a P-type MOSFET having a second source, a second drain, and a second gate;
   a bias resistor having a first end and a second end;
   a DC blocking capacitor having a third end and a fourth end, wherein the first gate is connected to the second gate and the first end of the bias resistor, wherein the first drain is connected to the second drain, the second end of the bias resistor, and a first output port, wherein the first end of the bias resistor is further connected to the third end of the DC blocking capacitor, wherein the fourth end of the DC blocking capacitor is connected to the first differential output signal, wherein the second source is connected to one of (i) a voltage source and (ii) a current source.

* * * * *